(12) United States Patent
Fort (10) Patent No.: US 7,636,264 B2
(45) Date of Patent: Dec. 22, 2009

(54) SINGLE-ENDED SENSE AMPLIFIER FOR VERY LOW VOLTAGE APPLICATIONS

(75) Inventor: Jimmy Fort, Aix en Provence (FR)

(73) Assignee: Atmel Corporation, San Jose, CA (US)

( * ) Notice: Subject to any disclaimer, the term of this patent is extended or adjusted under 35 U.S.C. 154(b) by 303 days.

(21) Appl. No.: 11/673,105

(22) Filed: Feb. 9, 2007

(65) Prior Publication Data

US 2008/0192555 A1 Aug. 14, 2008

(51) Int. Cl.
*G11C 7/06* (2006.01)
(52) U.S. Cl. ............................ 365/189.15; 365/189.06; 365/189.11; 365/189.05; 365/203; 327/51
(58) Field of Classification Search ................. 365/190, 365/196, 203, 205, 208, 189.06, 189.11, 365/189.05, 189.15; 327/51
See application file for complete search history.

(56) References Cited

U.S. PATENT DOCUMENTS

| | | | |
|---|---|---|---|
| 4,785,259 A | 11/1988 | Seelbach et al. | |
| 4,918,341 A | 4/1990 | Galbraith et al. | |
| 5,013,943 A | 5/1991 | Hirose | |
| 5,023,841 A * | 6/1991 | Akrout et al. | 365/205 |
| 5,493,533 A * | 2/1996 | Lambrache | 365/175 |
| 5,646,900 A | 7/1997 | Tsukude et al. | |
| 5,666,310 A | 9/1997 | Yu et al. | |
| 5,850,359 A | 12/1998 | Liu | |
| 5,886,934 A * | 3/1999 | Nagaoka et al. | 365/189.11 |
| 5,892,260 A | 4/1999 | Okumura et al. | |
| 6,049,496 A | 4/2000 | Forbes et al. | |
| 6,091,654 A | 7/2000 | Forbes et al. | |
| 6,094,394 A | 7/2000 | La | |

(Continued)

FOREIGN PATENT DOCUMENTS

| | | |
|---|---|---|
| JP | 2001-319488 | 11/2001 |
| WO | WO-2008/100428 A1 | 8/2008 |

OTHER PUBLICATIONS

"International Application Serial No. PCT/US2008/001696, International Search Report mailed Jun. 16, 2008", 3 pgs.

(Continued)

*Primary Examiner*—Andrew Q Tran
(74) *Attorney, Agent, or Firm*—Schwegman, Lundberg & Woessner P.A.

(57) ABSTRACT

A sense amplifier has a transimpedance amplifier capable of producing an output voltage level proportionate to a current variation sensed going into a bitline. A transconductance device is configured to produce varying bitline current in response to the transimpedance amplifier output voltage. The transconductance device is capable of utilizing the transimpedance amplifier output voltage as feedback to produce a bitline clamp voltage level. The transimpedance amplifier configured to produce an output voltage proportionate to a cell current of a selected memory cell and provide an output signal corresponding to a memory cell state. An output amplifier is coupled to the transimpedance amplifier and capable of producing an output signal level proportionate to the transimpedance amplifier output voltage. A bias circuit is coupled to the transimpedance amplifier and the output amplifier, the bias circuit is capable of producing reference mirror currents through the transimpedance amplifier and the output amplifier.

18 Claims, 5 Drawing Sheets

U.S. PATENT DOCUMENTS

| | | | |
|---|---|---|---|
| 6,104,066 | A | 8/2000 | Noble et al. |
| 6,235,569 | B1 | 5/2001 | Noble et al. |
| 6,349,060 | B1 * | 2/2002 | Ogura .................... 365/185.21 |
| 6,451,656 | B1 | 9/2002 | Yu |
| 6,466,059 | B1 | 10/2002 | Gaibotti et al. |
| 6,473,356 | B1 | 10/2002 | Raszka |
| 6,608,787 | B1 | 8/2003 | Daga et al. |
| 6,707,717 | B2 | 3/2004 | Jun-Lin |
| 7,092,278 | B2 * | 8/2006 | Ishida et al. ................. 365/148 |
| 7,221,605 | B2 | 5/2007 | Forbes |
| 7,304,903 | B2 | 12/2007 | Mukhopadhyay et al. |

OTHER PUBLICATIONS

"International Application Serial No. PCT/US2008/001696, Written Opinion Mailed Jun. 16, 2008", 6 pgs.

"U.S. Appl. No. 11/855,565, Copy of Application as filed with the USPTO on Sep. 14, 2007", (Sep. 14, 2007), 16 pages.

"U.S. Appl. No. 11/855,565, Non-Final Office Action mailed Nov. 19, 2008", 7 pages.

"U.S. Appl. No. 11/855,565, Response filed 3/19/09 to Non-Final Office Action mailed Nov. 19, 2008", 15 pages.

"U.S. Appl. No. 11/855,565, Final Office Action mailed Jul. 1, 2009", 7 pgs.

* cited by examiner

SINGLE-ENDED SENSE AMPLIFIER FOR VERY LOW VOLTAGE APPLICATIONS

TECHNICAL FIELD

The present invention relates to sense amplifiers, more particularly, to single-ended sense amplifiers operating with electrically erasable programmable read-only memories (EEPROMs) at very low magnitude supply voltages.

BACKGROUND ART

In memory design, a sense amplifier is a critical analog circuit. In EEPROM and flash memories the sense amplifier function is twofold. First, the precharge of a bitline to a proper value of clamp voltage is significant for providing calibrated sensing of a selected memory cell. A sense amplifier performs a critical function in assuring the bitline is precharged to a clamp voltage of sufficient magnitude to ensure proper sensing of memory cell current. Second, sensing a selected memory cell current flowing through the bitline is also critical. Magnitude of the memory cell current depends on the state of the cell and must be determined promptly and accurately in order to sustain a high level of system performance.

Figure 1:
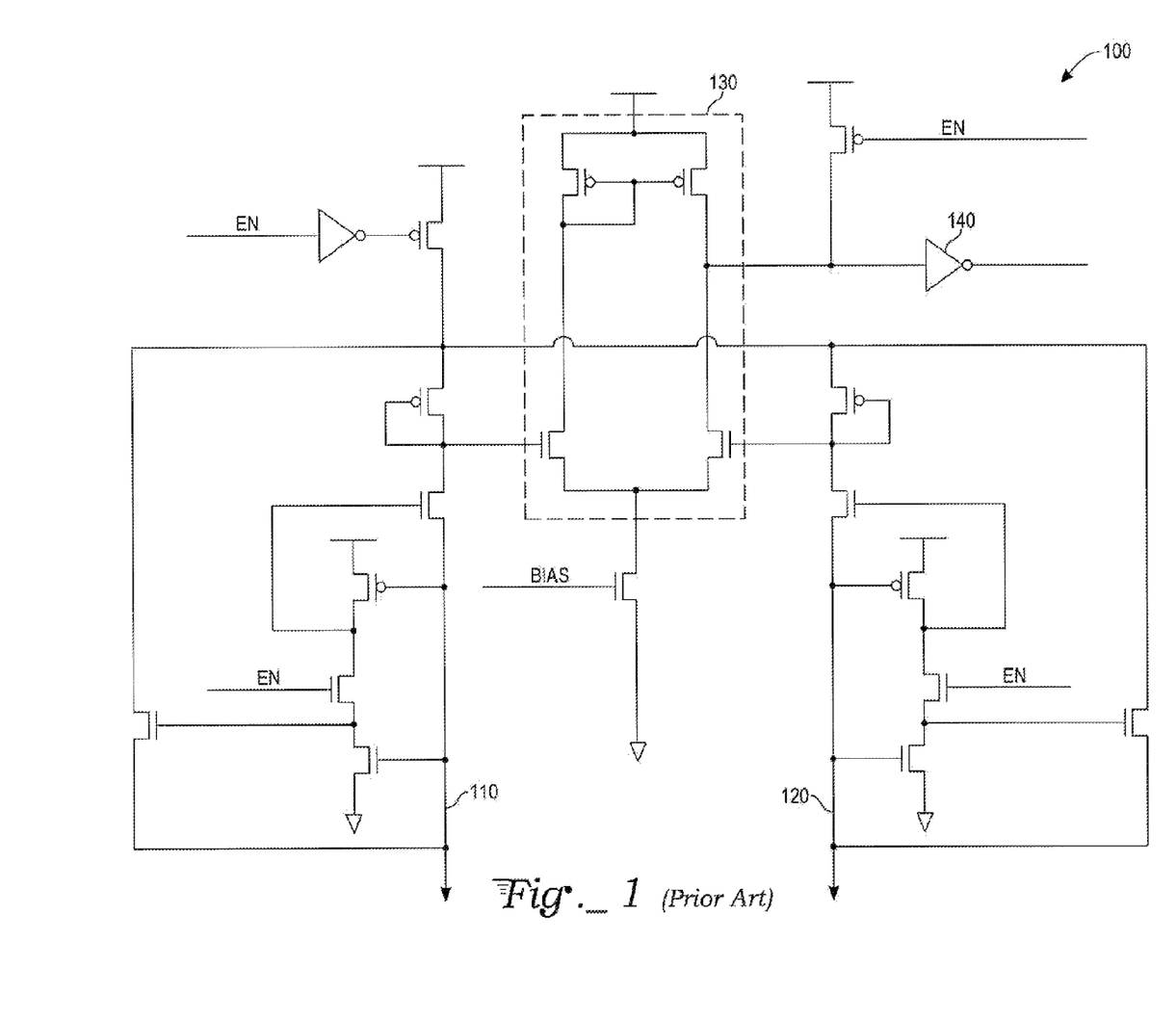
FIG. 1 is a schematic diagram of a prior art differential sense amplifier.

With reference to FIG. 1, a prior art sense amplifier 100 is based on a differential structure 130 in order to compare a current coming from a selected memory cell (not shown) to a fiducial current coming from a reference cell (not shown). The fiducial current flows on a reference bitline 110 and a memory cell current flows on a bitline 120 from the selected memory cell. The differential structure 130 compares the relative magnitudes of the voltages on the reference bitline 110 and the bitline 120. As different memory cells with differing states (i.e., cells storing either a 1 or a 0) are selected, the current flowing on the bitline 120 varies, producing different voltage levels at the corresponding input to the differential structure 130. The differential structure 130 amplifies the voltage difference and provides a corresponding voltage level to an output amplifier 140. The output amplifier 140 in turn amplifies and inverts the voltage level and provides it to the sense amplifier output terminal OUT.

Figure 2:
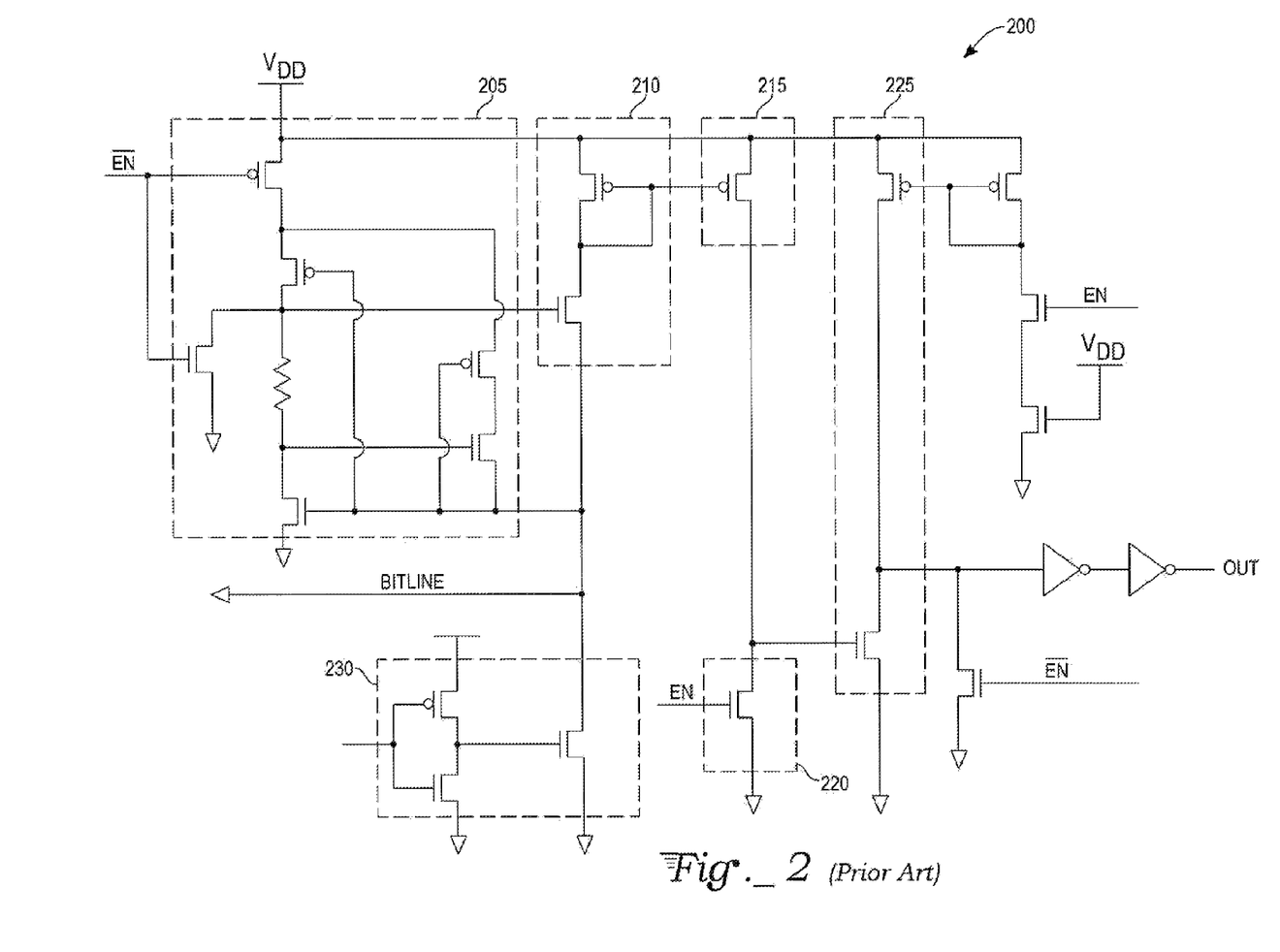
FIG. 2 is a schematic diagram of a prior art single-ended sense amplifier.

With reference to FIG. 2, a prior art single-ended current sense amplifier 200 has a precharge circuit 205 to maintain a stable voltage on a bitline BITLINE, a sensing circuit 210 coupled to the bitline BITLINE for sensing an amount of current flowing into the bitline BITLINE, a direct current amplification circuit 215 coupled to the sensing circuit for amplifying the current sensed on the bitline BITLINE, a current-to-voltage conversion circuit 220 for converting the sensed current to a voltage, and a voltage amplification circuit 225 for amplifying the voltage at the sense amplifier output. The sense amplifier also includes an overshoot filtering circuit 230 to filter out positive glitches on the bitline BITLINE.

Generally, a single-ended structure provides an advantage by eliminating a need to have a reference cell and a comparator circuit as are commonly used in differential sense amplifier structures. The single-ended amplifier provides a savings in test time and in the amount of die area used by the sense amplifier circuit. Additionally, the single-ended structure provides other advantages over the standard differential structures such as providing less sensitivity to mismatched circuit components, less process variation sensitivity, and improved access time at low supply voltages.

SUMMARY

In one embodiment, a sense amplifier comprises a transimpedance amplifier configured to sense a current variation into a bitline and produce an output voltage level proportionate to a current variation sensed. A transconductance device is coupled to the transimpedance amplifier and the bitline, the transconductance device capable of produce varying bitline current responsive to the transimpedance amplifier output voltage. An output amplifier is coupled to the transimpedance amplifier and is capable of producing an output signal level proportionate to the transimpedance amplifier output voltage. A bias circuit is coupled to the transimpedance amplifier and the output amplifier, the bias circuit is capable of producing bitline current through the transimpedance amplifier and the output amplifier.

In a second embodiment, a sense amplifier comprises a transimpedance means for sensing variation of a bitline current and produces an output voltage level proportionate to the variation in the bitline current sensed. A transconductance means produces varying bitline current responsive to an output voltage level of the transimpedance means, the transconductance means coupled to the transimpedance means and the bitline. An output means produces an output signal level proportionate to the transimpedance means outputs a voltage level, the output means coupled to the transimpedance means. A biasing means produces bitline current through the transimpedance means and the output means, the biasing means is coupled to the transimpedance means and the output means.

A further embodiment is a method of producing a clamp voltage on a memory bitline, the method comprises configuring a magnitude of the clamp voltage, injecting a bitline current into the bitline, monitoring a magnitude of bitline current being injected on the bitline, producing a magnitude of feedback voltage responsive to the bitline current magnitude monitored, throttling the bitline current injected responsive to the magnitude of feedback voltage produced, and determining a magnitude of bitline current injected being less than a minimum bitline current to establish the clamp voltage configured.

An additional embodiment is a method of sensing a state of a memory cell, the method comprising selecting a memory cell, producing a bitline current, coupling the bitline current to the selected memory cell, sensing a magnitude of the bitline current, producing an output voltage level responsive to the magnitude of bitline current sensed, and detecting a magnitude of output voltage passing through a threshold voltage level.

DETAILED DESCRIPTION

Figure 3:
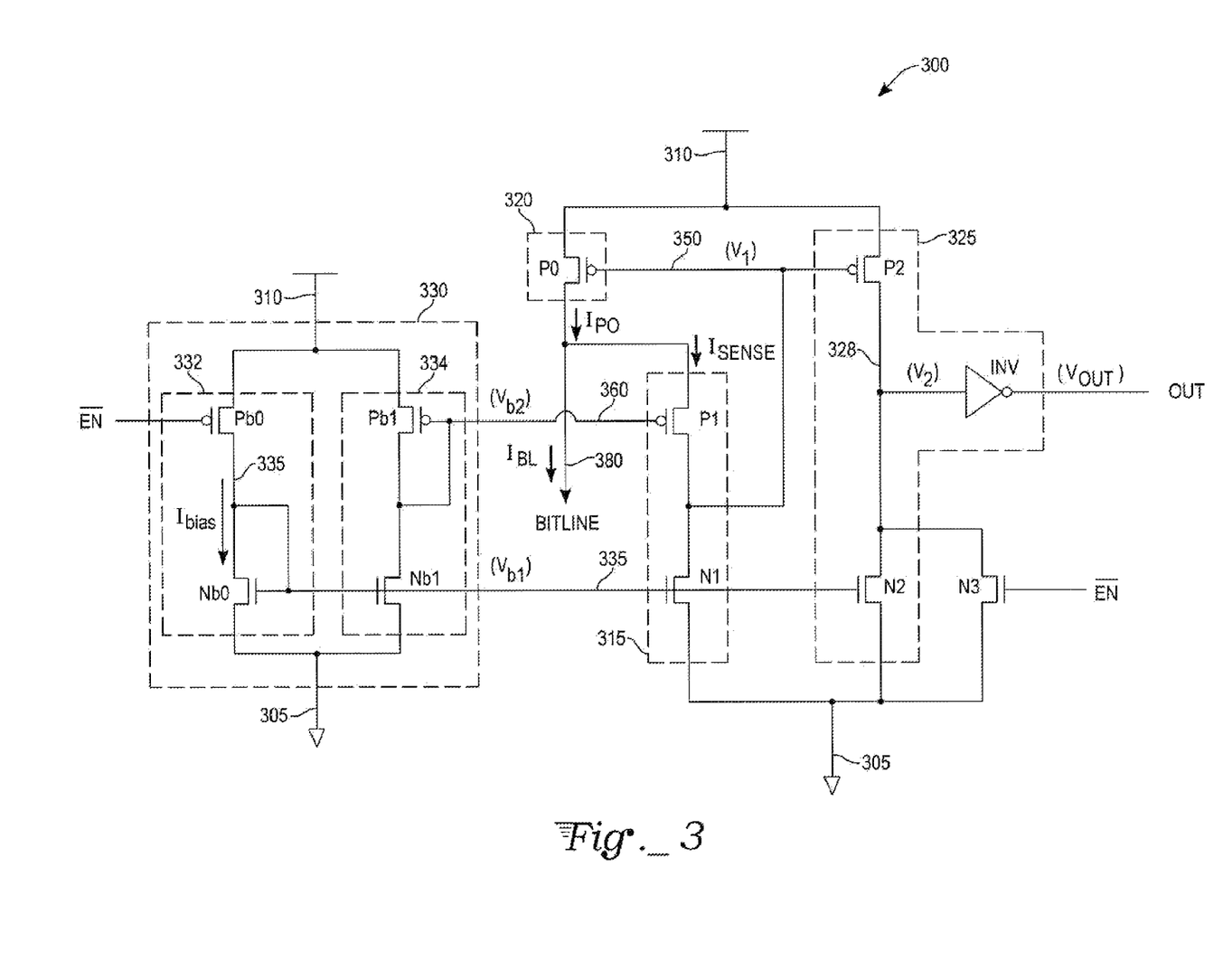
FIG. 3 is a schematic diagram of an exemplary embodiment of a single-ended sense amplifier.

With reference to FIG. 3, a bias circuit 330 is coupled to a transimpedance amplifier 315 in an exemplary embodiment of a single-ended amplifier 300. The bias circuit 330 is coupled between $V_{DD}$ 310 and Ground 305. The bias circuit 330 comprises, for example, a first current mirror 332 in parallel with a second current mirror 334. A first ENABLE_BAR terminal $\overline{EN}$ is coupled as an input node to both the bias circuit 330 and a first current mirror pullup device Pb0. The first current mirror pullup device Pb0 and a first current mirror pulldown device Nb0 are coupled in series between $V_{DD}$ 310 and Ground 305.

The first current mirror pullup device Pb0 and a first current mirror pulldown device Nb0 may be, for example, implemented as a PMOS and an NMOS transistor, respectively. A drain and gate of the first current mirror pulldown device Nb0 are coupled together at a series coupling point with the first current mirror pullup device Pb0 to produce a first current mirror output node 335. One skilled in the art will appreciate that even though the first current mirror 332 is an exemplary current biasing circuit, alternate examples of current biasing circuits exist. For example, using solid state circuit elements or device configurations that take into account fundamental thermal characteristics of voltage or current generation versus temperature produce current biasing circuits with characteristics proportional to absolute temperature (PTAT) or complementary to absolute temperature (CTAT) with regard to electrical characteristic tracking.

The first current mirror output node 335 is coupled to a second current mirror pulldown device Nb1. A second current mirror pullup device Pb1 is coupled in series with the second current mirror pulldown device Nb1, the series combination coupled between $V_{DD}$ 310 and Ground 305 forming the second current mirror 334. The second current mirror pullup device Pb1 and a second current mirror pulldown device Nb1 may be, for example, implemented as a PMOS and an NMOS transistor respectively. A drain and gate of the second current mirror pullup device Pb1 are coupled together at a series coupling point to produce a second current mirror output node 360.

The first current mirror output node 335 and the second current mirror output node 360 are input nodes to a transimpedance amplifier pulldown device N1 and a transimpedance amplifier pullup device P1, respectively. The transimpedance amplifier pullup device P1 and the transimpedance amplifier pulldown device N1 may be, for example, a PMOS and an NMOS transistor, respectively. The transimpedance amplifier pullup device P1 and the transimpedance amplifier pulldown device N1 are coupled in series between a bitline 380 (BITLINE) and ground 305, the series combination forming the transimpedance amplifier 315. The series coupling point between the transimpedance amplifier pullup device P1 and the transimpedance amplifier pulldown device N1 forms a transimpedance amplifier output node 350 and an output node of the transimpedance amplifier 315. The transimpedance amplifier output node 350 is coupled as an input to the transimpedance amplifier pulldown device N1.

The transimpedance amplifier output node 350 is coupled to an input node of a transconductance device 320. The transconductance device 320 is coupled between $V_{DD}$ 310 and the bitline 380. The transconductance device 320 may be, for example, a transconductance PMOS transistor P0.

The transimpedance amplifier output node 350 is coupled at a first input node to an output amplifier 325 and an input node to an output pullup device P2. The first current mirror output node 335 is coupled to a second input node to the output amplifier 325 and an input node to an output pulldown device N2. The output pullup device P2 and the output pulldown device N2 may be, for example, a PMOS and an NMOS transistor respectively. One skilled in the art would readily recognize that PMOS and NMOS transistors configured as pullup and pulldown devices, as exemplified in various occurrences above, may alternatively be implemented with complementary bipolar devices or any of a number of corresponding semiconductor switching devices with complementary switching characteristics.

A switching threshold node 328 is formed at a series coupling point between the output pullup device P2 and the output pulldown device N2. The switching threshold node 328 is coupled to an input node of an output inverter INV. An output node of the output inverter INV forms the output terminal OUT of the single-ended sense amplifier 300. An output enable device N3 is coupled between the switching threshold node 328 and ground 305. A second ENABLE_BAR terminal EN is coupled as an input node to the gate of the output enable device N3.

A first function of the exemplary single-ended sense amplifier 300 is to precharge the bitline 380. The single-ended sense amplifier 300 produces a source current $I_{P0}$, which is the current through, for example, the transconductance PMOS transistor P0. The source current $I_{P0}$ provides the source of current for a bitline current $I_{BL}$ and a sense current $I_{sense}$. The bitline current $I_{BL}$ is the current flowing into the bitline 380. The sense current $I_{sense}$ is the current flowing into the transimpedance amplifier 315.

The bitline current $I_{BL}$ is the sum of the current components provided to the bitline 380 for a precharge current $I_{prechg}$ and a memory cell current $I_{cell}$. The magnitudes of the precharge current $I_{prechg}$ (not shown) and the memory cell current $I_{cell}$ (not shown) depend on selection of a memory cell (not shown), the selected memory cell state, and the electrical condition of the bitline 380.

A precharge current $I_{prechg}$ is that component of the bitline current $I_{BL}$ supplied for precharging the bitline 380 during a precharge phase of operation. In the case where a memory cell is not selected, the precharge current $I_{prechg}$ is supplied to the bitline 380 until the bitline voltage $V_{BL}$ reaches the bitline clamp voltage $V_{BL\_CLAMP}$. The magnitude of the bitline clamp voltage $V_{BL\_CLAMP}$ is configured to be close to $V_{DD}$ in order to establish a reference level of voltage on the bitline 380. With low magnitude supply voltages, for example, when $V_{DD} \leq 1.2$ V, being able to configure the bitline clamp voltage $V_{BL\_CLAMP}$ as close to the supply voltage $V_{DD}$ as possible is significant in the exemplary single-ended sense amplifier 300 compared to previous attempts to design sense amplifiers.

If the bitline voltage $V_{BL}$ is initially 0 volts (V), the transimpedance amplifier pullup device P1 is off. In this bias situation, the drain voltage of the transimpedance amplifier pullup device P1 is the bitline voltage $V_{BL}$ (i.e., 0 V) and the gate voltage is a second current mirror voltage $V_{b2}$, which is the output voltage on second current mirror output node 360. With the transimpedance amplifier pullup device P1 off, a transimpedance amplifier output voltage $V_1$, which is the voltage on the transimpedance amplifier output node 350, is set to 0 V by the transimpedance amplifier pulldown device N1. The transimpedance amplifier pulldown device N1 is on due to a gate input node being supplied by a first current mirror voltage $V_{b1}$, which is the voltage on the first current mirror output node 335.

The transimpedance amplifier output voltage $V_1$ (0 V) is provided to a gate input of the transconductance device 320. With 0 V supplied to the gate input, the transconductance PMOS transistor P0 is turned on and injects the precharge current $I_{prechg}$ to the bitline 380. The magnitude of bitline current $I_{BL}$ is equal to the transconductance PMOS transistor P0 saturation current, since, for example, $V_{SG\_P0} = V_{DD}$.

The bitline voltage $V_{BL}$ increases due to the injection of the precharge current $I_{prechg}$. As the bitline voltage $V_{BL}$ increases, the transimpedance amplifier pullup device P1 begins to turn on and conduct a transimpedance amplifier pullup device current $I_{P1}$. With the transimpedance amplifier pullup device P1 turning on, a magnitude of the transimpedance amplifier output voltage $V_1$ increases. The increase in magnitude of the transimpedance amplifier output voltage $V_1$ occurs since the bitline voltage $V_{BL}$ is the source node voltage and the second current mirror voltage $V_{b2}$ is the gate voltage of the transimpedance amplifier pullup device P1. As the magnitude of the transimpedance amplifier output voltage $V_1$ increases, the precharge current $I_{prechg}$ decreases. Increasing transimpedance amplifier output voltage $V_1$, applied to the gate of the transconductance PMOS transistor P0, reduces the $V_{gs}$ of the transconductance PMOS transistor P0, until finally, the precharge current $I_{prechg}$ stops.

The bitline voltage $V_{BL}$ reaches the bitline clamp voltage $V_{BL\_CLAMP}$ when the capacitance of the bitline is charged up as fully as possible by the biasing from transconductance device 320 (i.e., the transconductance PMOS transistor P0). The bitline clamp voltage $V_{BL\_CLAMP}$ is attained at the maximum precharge condition, which occurs when the precharge current $I_{prechg}$ and the bitline current $I_{BL}$ are zero and $$I_{P0} = I_{bias} = I_{P1} = I_{N1}$$

Where $I_{N1}$ is a transimpedance amplifier pulldown device current $I_{N1}$.

This equality occurs when the transconductance PMOS transistor P0, the transimpedance amplifier pullup device P1, and the transimpedance amplifier pulldown device N1 are all in saturation. The saturated condition of the devices lead to the expression $$I_{P1} = I_{bias} = \frac{K_p}{2} \left|\frac{W}{L}\right|_{P1} (V_{BL} - V_{b2} - |V_{tP1}|)^2$$

(where $K_p$ is a p-type device process gain factor, W is the width, and L is the length of the device P1) which, when the expression is that solved for $V_{BL}$ yields $$V_{BL} = \sqrt{\frac{2 \cdot I_{bias}}{K_P \left|\frac{W}{L}\right|_{P1}}} + V_{b2} + |V_{tP1}|.$$

Additionally, the transconductance PMOS transistor P0 must be in saturation, which is a condition which gives $$V_{BL} = V_{DD} - |V_{ds\_sat}|_{P0}, \text{ which yields}$$

$$V_{DD} - V_{BL} \geq V_{DD} - V_1 - |V_{tP0}|$$

which when solved for $V_{BL}$ produces $$V_{BL} \leq V_1 + |V_{tP0}|,$$

where $V_2 = V_{DD} - \sqrt{\frac{2 \cdot I_{bias}}{K_P \left|\frac{W}{L}\right|_{P0}}} + |V_{tP0}|$ Due to electrical proximity to $V_{DD}$ and the fact that the transconductance device 320 may be, for example, comprised of a transconductance PMOS transistor P0, the bitline clamping voltage may be produced at a voltage level within one device voltage drop of the power source voltage level $V_{DD}$.

Additionally, since an input to the transimpedance amplifier 315 is coupled to the bitline 380, the transimpedance amplifier input is also electrically coupled within a single device voltage drop of the power source voltage level $V_{DD}$.

A second function of the exemplary single-ended sense amplifier 300 is to sense a memory cell state. A memory cell is coupled to the bitline 380 when selected, for example, is a read operation. The current flowing through a selected memory cell is the memory cell current $I_{cell}$.

In the case where a selected memory cell is off, the current flowing through P0 is equal to the mirror current $I_{bias}$. The transimpedance amplifier output voltage $V_1$ depends on the sizing of P0. A sizing ratio, the geometry dependent term $$\left(\frac{W}{L}\right)$$

in a typical MOS device Beta (β) for the output of pullup device P2, is lower than the sizing ratio for the transconductance PMOS transistor P0. Therefore, the relative drive strength of the transconductance PMOS transistor P0 is greater than the drive strength of the output of pullup device P2. With the transconductance PMOS transistor P0 configured with relatively strong drive, the bitline voltage $V_{BL}$ is held stiffly to a high voltage level and the magnitude of the transimpedance amplifier output voltage $V_1$ is relatively high.

With the relatively high voltage level of the transimpedance amplifier output voltage $V_1$ being the gate voltage of the output pullup device P2, the drive strength of the pullup device P2 is relatively weak in addition to the weakening effect due to the sizing ratio configured for the device as mentioned above. The relatively weaker drive strength of the output of pullup device P2 allows the output pulldown device N2 to pull down the switching threshold voltage $V_2$ low enough that the inequality $V_2 < Vth_{INV}$ is true, where $Vth_{INV}$ is the logic-inversion threshold voltage for the output inverter INV. With the inequality $V_2 < Vth_{INV}$ true, $V_{OUT}$, the voltage on the output node OUT rises to VDD.

In the memory cell current $I_{cell}$ is not equal to 0 amps (i.e., the memory cell is on), the source current $I_{P0}$ is the memory cell current $I_{cell}$ plus the sense current $I_{sense}$. With the current mirror effect present at the transimpedance amplifier pulldown device N1, the sense current $I_{sense}$ is equal to the mirror current $I_{bias}$. With the sum of the memory cell current $I_{cell}$ plus the mirror current $I_{bias}$ flowing as the source current $I_{P0}$, the transconductance PMOS transistor P0 drain-source voltage $VDS_{P0}$ commences to increase and causes a relatively lower voltage level input for the source node voltage of the transimpedance amplifier pullup device P1, which in turn commences to cause a relatively lower voltage level for the transimpedance amplifier output voltage $V_1$.

The transimpedance amplifier output voltage $V_1$ is fed back as the gate voltage of the transconductance PMOS transistor P0 by a feedback path through the bitline 380, the transimpedance amplifier pullup device P1, and the transimpedance amplifier output node 350. Through the feedback path, the commencement of the increase in the drain-source voltage $VDS_{P0}$ promptly produces a relatively lower transimpedance amplifier output voltage $V_1$, which increases the drive strength of the transconductance PMOS transistor P0 and maintains a stable bitline voltage $V_{BL}$.

With the relatively lower transimpedance amplifier output voltage $V_1$ being the gate voltage of the output pullup device P2, the drive strength of the pullup device P2 is relatively stronger. The relatively stronger drive strength of the output of pullup device P2 counteracts the output pulldown device N2 and pulls up the switching threshold voltage $V_2$ high enough that the inequality $V_2 > Vth_{INV}$ is true, where $Vth_{INV}$ is the logic-inversion threshold voltage for the output inverter INV. With the inequality $V_2 > Vth_{INV}$ true, $V_{OUT}$, the voltage on the output node OUT is pulled down to the Ground voltage level.

The feedback path, mentioned above, creates a variation in the transimpedance amplifier output voltage $V_1$ as a function of the memory cell current $I_{cell}$. A time-variant form of the transimpedance amplifier output voltage $V_1$ as a function of the associated gains in the feedback loop is given by $$v1 = \frac{rds_{N1}}{1 + gm_{P0} \cdot rds_{N1}} \cdot I_{cell}$$

where the resistance $rds_{N1}$ is the gain of the transimpedance amplifier 315 and $gm_{p0}$ is again of the transconductance PMOS transistor P0. In consideration that $$gm_{P0} \cdot rds_{N1} \gg 1$$

the time-variant form of $V_1$ becomes $$v1 \approx \frac{1}{gm_{P0}} \cdot I_{cell}.$$

Solving for a source current $I_{P0}$ time-variant form yields $$i_{P0} = gm_{P0} * v1 = I_{cell}.$$

Determining the inversion threshold of the output amplifier 325 begins with the observation that the output pullup device current $I_{P2}$ equals the output pulldown device current $I_{N2}$ or $$I_{P2} = I_{N2}$$

By the current mirror operation between the first current mirror pulldown device Nb0 and the output pulldown device N2

$$I_{N2} = I_{bias}.$$

The β-ratio, n, between the transconductance PMOS transistor P0 and the output pullup device P2, where $$n = \frac{\left|\frac{W}{L}\right|_{P0}}{\left|\frac{W}{L}\right|_{P2}} \text{(and } n \neq 1\text{)}$$

determines the channel current relationship between the devices and is given as $$I_{P2} \approx \frac{I_{P0}}{n} \approx \frac{I_{bias} + I_{cell\_th}}{n}$$

where $I_{cell\_th}$ is the memory cell threshold current. Since the gate threshold voltage $V_{gs}$ is the same for the transconductance PMOS transistor P0 and the output pullup device P2, $I_{bias}$ is given as $$I_{bias} \approx \frac{I_{bias} + I_{cell\_th}}{n}.$$

Solving for the memory cell threshold current yields $$I_{cell\_th} \approx I_{bias} \cdot (n-1)$$

with the note that a condition is $n \neq 1$.

The exemplary single-ended sense amplifier 300 is enabled by providing a low logic level voltage on the ENABLE_BAR terminals $\overline{EN}$. The low logic level voltage is provided as the gate voltage to the output enable device N3. The low level gate voltage disables the output enable device N3 and allows the switching threshold output 328 to operate freely. Additionally, the low logic level voltage provided to the ENABLE_BAR terminal $\overline{EN}$ at the first current mirror pull-up device Pb0 turns on the device and enables the first current mirror 332.

The exemplary single-ended sense amplifier 300 is disabled by providing a high logic level voltage on the ENABLE_BAR terminals $\overline{EN}$. The high logic level voltage is provided as the gate voltage to the output enable device N3. The high level gate voltage enables the output enable device N3, turning the device on which pulls the switching threshold output 328 to Ground voltage level. Additionally, the high logic level voltage provided to the ENABLE_BAR $\overline{EN}$ terminal at the first current mirror pull-up device Pb0 turns off the device and disables the first current mirror 332.

Figure 4:
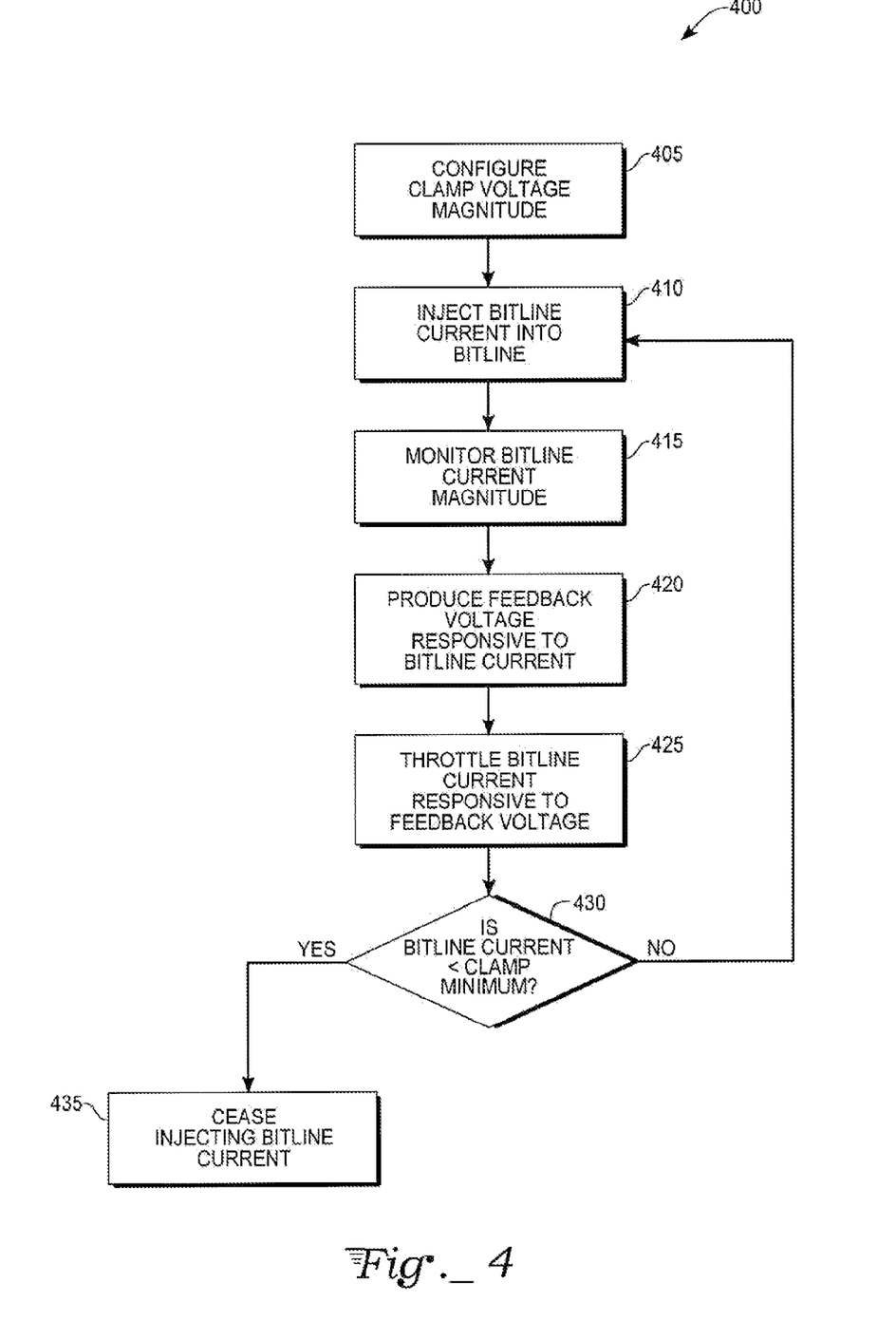
FIG. 4 is a process flow diagram of a method to produce a clamping voltage according to the circuit of FIG. 3.

With reference to FIG. 4, an exemplary method of producing a clamp voltage on a memory bitline 400 commences with a first step of configuring a magnitude of a clamp voltage 405. The method continues with injecting a bitline current into the bitline 410 followed by monitoring a magnitude of bitline current being injected into the bitline 415. A next step is producing a magnitude of feedback voltage responsive to the bitline current magnitude monitored 420 followed by throttling the bitline current injected responsive to the magnitude of feedback voltage produced 425. Next, a determination is made of whether a magnitude of bitline current injected is less than a minimum to establish the clamp voltage 430. If the bitline current is less than a minimum to establish the clamp voltage, a next step is ceasing to inject bitline current 435. If the bitline current is greater than a minimum to establish the clamp voltage, a step is taken to continue injecting bitline current 410.

Figure 5:
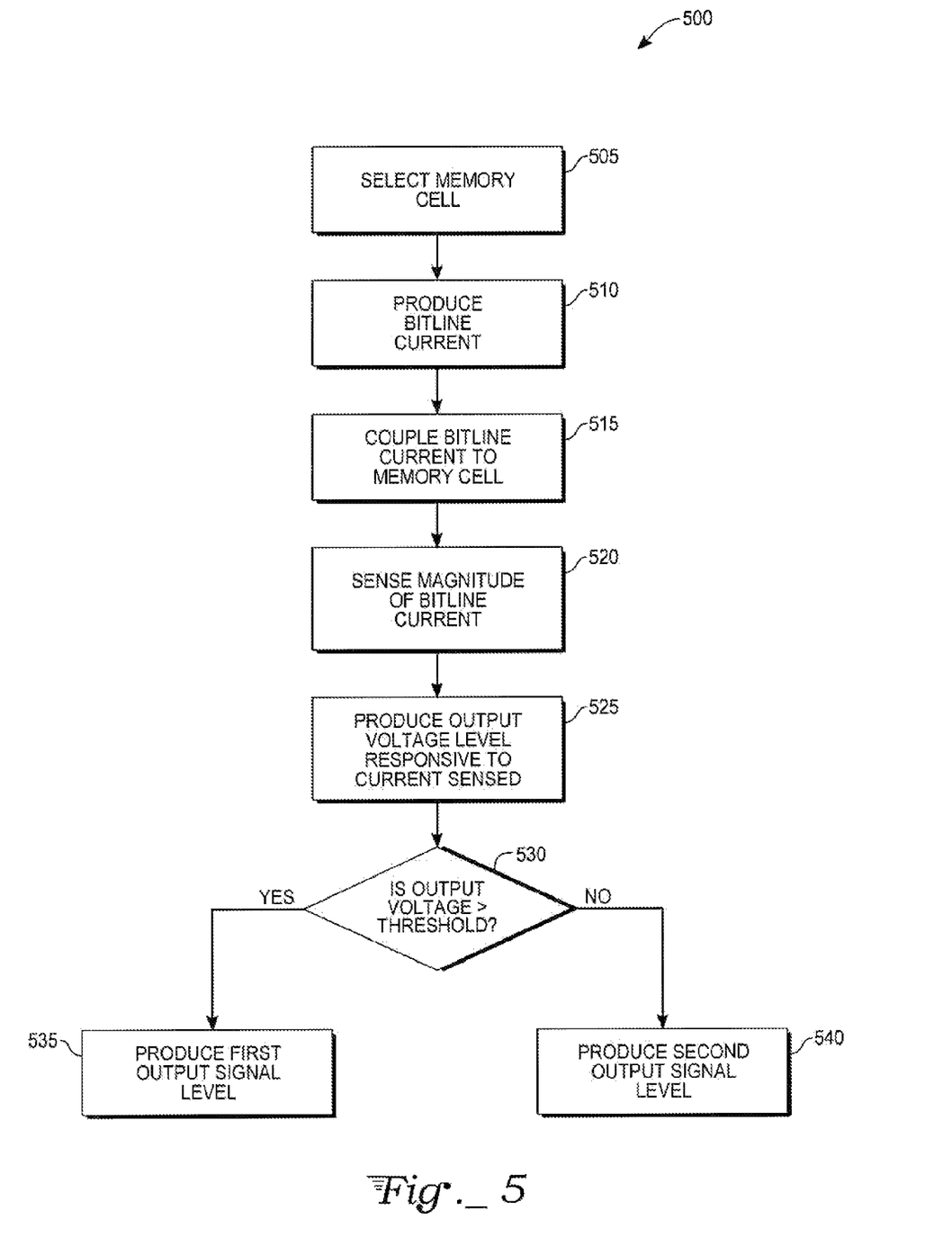
FIG. 5 is a process flow diagram of a method of sensing a memory cell state according to the circuit of FIG. 3.

With reference to FIG. 5, an exemplary method of sensing a state of a memory cell 500 begins with selecting a memory cell 505. A next step of the method is producing a bitline current 510 followed by coupling the bitline current to the selected memory cell 515. The method continues with sensing a magnitude of the bitline current 520 and producing an output voltage level responsive to the magnitude of bitline current sensed 525. The method goes on with determining whether a magnitude of output voltage passes through a threshold level 530. The method continues with producing a first output signal level 535 if the determination of the output voltage being greater than a threshold is true. If the output voltage is less than the threshold, the method continues with outputting a second output signal level 540.

It would be clear to one of skill in the art that alternate embodiments of the above detailed description may exist. Therefore, the above description is illustrative and not restrictive. The scope of the invention should therefore be determined by reference to the appended claims and not by the above description.

What is claimed is:
1. A sense amplifier comprising:
a transimpedance amplifier configured to sense a current variation into a bitline and produce a transimpedance amplifier output voltage proportionate to a sensed current variation;
a transconductance device coupled to the transimpedance amplifier and the bitline, the transconductance device capable of producing varying bitline current responsive to the transimpedance amplifier output voltage;

an output amplifier coupled to the transimpedance amplifier and capable of producing an output signal proportionate to the transimpedance amplifier output voltage; and a bias circuit coupled to the transimpedance amplifier and the output amplifier, the bias circuit capable of producing bitline current through the transimpedance amplifier and the output amplifier.

2. The sense amplifier of claim 1, wherein the bitline current variation sensed by the transimpedance amplifier indicates a memory cell state.

3. The sense amplifier of claim 1, wherein the bitline current produced by the transconductance device is capable of producing a bitline clamping voltage.

4. The sense amplifier of claim 3, wherein a magnitude of the bitline clamping voltage produced is within one device voltage drop of a power source voltage level.

5. The sense amplifier of claim 1, wherein a magnitude of the transimpedance amplifier output voltage produces an indication of a memory cell state through feedback of a portion of the bitline current produced by the transconductance device, the portion of the bitline current produced being a memory cell current.

6. The sense amplifier of claim 1, wherein the transimpedance amplifier is electrically coupled within a single device voltage drop of a power source voltage level.

7. A sense amplifier comprising:

a transimpedance means for sensing variation of a bitline current and producing a transimpedance output voltage proportionate to the variation in the bitline current sensed;

a transconductance means for producing varying bitline current responsive to the transimpedance output voltage, the transconductance means coupled to the transimpedance means and the bitline;

an output means for producing an output signal proportionate to the transimpedance output voltage, the output means coupled to the transimpedance means; and a biasing means for producing bitline current through the transimpedance means and the output means, the biasing means coupled to the transimpedance means and the output means.

8. The sense amplifier of claim 7, wherein the variation of the bitline current sensed by the transimpedance means is capable of indicating a memory cell state.

9. The sense amplifier of claim 7, wherein the varying bitline current produced by the transconductance means is capable of producing a bitline clamping voltage.

10. The sense amplifier of claim 9, wherein a magnitude of the bitline clamping voltage produced is within one device voltage drop of a power source voltage level.

11. The sense amplifier of claim 7, wherein the transimpedance output voltage produces an indication of a memory cell state through feedback of a portion of the bitline current produced by the transconductance means, the portion of the bitline current produced being a memory cell current.

12. The sense amplifier of claim 7, wherein the transimpedance means is electrically coupled within a single device voltage drop of a power source voltage level.

13. A method of producing a clamp voltage on a memory bitline, the method comprising:

configuring a magnitude of the clamp voltage;

injecting a bitline current into the bitline;

monitoring a magnitude of bitline current being injected on the bitline;

producing a magnitude of feedback voltage responsive to the bitline current magnitude monitored;

throttling the injected bitline current responsive to the magnitude of feedback voltage produced; and determining a magnitude of bitline current injected being less than a minimum bitline current to establish the configured clamp voltage.

14. The method of producing a clamp voltage on a memory bitline of claim 13, further comprising ceasing to inject the bitline current into the bitline if the magnitude of bitline current is determined to be less than the minimum bitline current to establish the clamp voltage.

15. The method of producing a claim voltage on a memory bitline of claim 13, further comprising continuing to inject the bitline current into the bitline if the magnitude of bitline current is determined to be greater than the minimum bitline current to establish the clamp voltage.

16. A method of sensing a state of a memory cell, the method comprising:

selecting the memory cell;

producing a bitline current;

coupling the bitline current to the selected memory cell;

sensing a magnitude of the bitline current;

producing an output voltage level responsive to the magnitude of the sensed bitline current; and determining a magnitude of output voltage passing through a threshold voltage level.

17. The method of sensing a state of a memory cell of claim 16, wherein the threshold voltage level is a delimiter of the memory cell state.

18. The method of sensing a state of a memory cell of claim 16, further comprising producing an output signal level responsive to the output voltage magnitude and relative to the threshold voltage level.

* * * * *

UNITED STATES PATENT AND TRADEMARK OFFICE
CERTIFICATE OF CORRECTION

PATENT NO. : 7,636,264 B2 Page 1 of 1
APPLICATION NO. : 11/673105
DATED : December 22, 2009
INVENTOR(S) : Jimmy Fort It is certified that error appears in the above-identified patent and that said Letters Patent is hereby corrected as shown below:

In column 2, line 63, after "single-ended" insert -- sense --.

In column 5, line 58, delete "$V_2$" and insert -- $V_1$ --, therefor.

In column 6, line 7, after "example," delete "is" and insert -- in --, therefor.

In column 6, line 41, delete "In" and insert -- If --, therefor.

In column 10, line 30, in Claim 15, delete "claim" and insert -- clamp --, therefor.

In column 10, line 43, in Claim 16, delete "determining" and insert -- detecting --, therefor.

Signed and Sealed this

Twenty-third Day of March, 2010

David J. Kappos
*Director of the United States Patent and Trademark Office*